(12) United States Patent
Chen et al.

(10) Patent No.: US 7,906,836 B2
(45) Date of Patent: Mar. 15, 2011

(54) HEAT SPREADER STRUCTURES IN SCRIBE LINES

(75) Inventors: Hsien-Wei Chen, Sinying (TW); Yu-Wen Liu, Taipei (TW); Jyh-Cherng Sheu, Hsin-Chu (TW); Hao-Yi Tsai, Hsin-Chu (TW); Shin-Puu Jeng, Hsin-Chu (TW); Chen-Hua Yu, Hsin-Chu (TW); Shang-Yun Hou, Jubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 10 days.

(21) Appl. No.: 12/347,184

(22) Filed: Dec. 31, 2008

(65) Prior Publication Data

US 2010/0123219 A1    May 20, 2010

Related U.S. Application Data

(60) Provisional application No. 61/114,770, filed on Nov. 14, 2008.

(51) Int. Cl.
*H01L 23/34* (2006.01)

(52) U.S. Cl. .................. 257/675; 257/E21.523; 438/122

(58) Field of Classification Search .................. 257/675, 257/706, 620, E21.523; 438/122, 462
See application file for complete search history.

(56) References Cited

U.S. PATENT DOCUMENTS

| | | | |
|---|---|---|---|
| 5,047,711 A | 9/1991 | Smith et al. | |
| 5,096,855 A | 3/1992 | Vokoun, III | |
| 5,136,364 A | 8/1992 | Byrne | |
| 5,206,181 A | 4/1993 | Gross | |
| 5,239,191 A | 8/1993 | Sakumoto et al. | |
| 5,285,082 A | 2/1994 | Axer | |
| 5,371,411 A | 12/1994 | Hara et al. | |
| 5,751,065 A | 5/1998 | Chittipeddi et al. | |
| 5,831,330 A | 11/1998 | Chang | |
| 5,834,829 A | 11/1998 | Dinkel et al. | |
| 6,022,791 A | 2/2000 | Cook et al. | |
| 6,114,766 A | 9/2000 | Shields | |
| 6,121,677 A | 9/2000 | Song et al. | |

(Continued)

FOREIGN PATENT DOCUMENTS

CN    1542505 A    11/2004

(Continued)

OTHER PUBLICATIONS

Pidin, S., et al., "MOSFET Current Drive Optimization Using Silicon Nitride Capping Layer for 65-nm Technology Node," 2004 Symposium on VLSI Technology Digest of Technical Papers, IEEE, Jul. 2004, pp. 54-55.

(Continued)

*Primary Examiner* — Matthew S Smith
*Assistant Examiner* — Michele Fan
(74) *Attorney, Agent, or Firm* — Slater & Matsil, L.L.P.

(57) ABSTRACT

An integrated circuit structure includes a first chip including a first edge; and a second chip having a second edge facing the first edge. A scribe line is between and adjoining the first edge and the second edge. A heat spreader includes a portion in the scribe line, wherein the heat spreader includes a plurality of vias and a plurality of metal lines. The portion of the heat spreader in the scribe line has a second length at least close to, or greater than, a first length of the first edge.

15 Claims, 7 Drawing Sheets

U.S. PATENT DOCUMENTS

| | | | |
|---|---|---|---|
| 6,300,223 B1 | 10/2001 | Chang et al. | |
| 6,358,839 B1 | 3/2002 | Li et al. | |
| 6,365,958 B1 | 4/2002 | Ibnabdeljalil et al. | |
| 6,384,463 B1 | 5/2002 | Miles et al. | |
| 6,483,173 B2 | 11/2002 | Li et al. | |
| 6,492,716 B1 | 12/2002 | Bothra et al. | |
| 6,495,918 B1 | 12/2002 | Brintzinger | |
| 6,521,975 B1 | 2/2003 | West et al. | |
| 6,566,736 B1 | 5/2003 | Ogawa et al. | |
| 6,605,861 B2 | 8/2003 | Toyoda | |
| 6,796,024 B2* | 9/2004 | Katoh et al. | 29/832 |
| 6,806,168 B2 | 10/2004 | Towle et al. | |
| 6,841,455 B2 | 1/2005 | West et al. | |
| 6,861,754 B2 | 3/2005 | Lin et al. | |
| 6,861,755 B2 | 3/2005 | Hosoda et al. | |
| 6,876,062 B2 | 4/2005 | Lee et al. | |
| 6,876,064 B2 | 4/2005 | Matumoto et al. | |
| 6,876,946 B2 | 4/2005 | Yasuda et al. | |
| 6,939,736 B2 | 9/2005 | Grabham et al. | |
| 6,963,389 B2 | 11/2005 | Fukada | |
| 6,998,712 B2 | 2/2006 | Okada et al. | |
| 7,042,099 B2 | 5/2006 | Kurashima et al. | |
| 7,087,452 B2 | 8/2006 | Joshi et al. | |
| 7,126,225 B2 | 10/2006 | Su et al. | |
| 7,126,255 B2 | 10/2006 | Yamaguchi et al. | |
| 7,129,565 B2 | 10/2006 | Watanabe et al. | |
| 7,129,566 B2 | 10/2006 | Uehling et al. | |
| 7,135,384 B2 | 11/2006 | Takyu et al. | |
| 7,138,297 B2 | 11/2006 | Iijima et al. | |
| 7,138,700 B2 | 11/2006 | Tomita et al. | |
| 7,145,211 B2 | 12/2006 | Millikarjunaswamy et al. | |
| 7,235,834 B2 | 6/2007 | Fukada | |
| 7,235,864 B2 | 6/2007 | Lee | |
| 7,259,445 B2* | 8/2007 | Lau et al. | 257/675 |
| 7,291,874 B2 | 11/2007 | Hsu | |
| 7,294,937 B2 | 11/2007 | Su et al. | |
| 7,335,577 B2 | 2/2008 | Daubenspeck et al. | |
| 7,387,950 B1 | 6/2008 | Kuo et al. | |
| 7,407,835 B2 | 8/2008 | Chuang | |
| 7,453,128 B2 | 11/2008 | Tsutsue et al. | |
| 7,456,507 B2 | 11/2008 | Yang | |
| 7,646,078 B2 | 1/2010 | Jeng et al. | |
| 2001/0005617 A1 | 6/2001 | Feurle et al. | |
| 2001/0008296 A1 | 7/2001 | Gelsomini et al. | |
| 2001/0019848 A1 | 9/2001 | Misewich et al. | |
| 2002/0024115 A1 | 2/2002 | Ibnabdeljalil et al. | |
| 2003/0003677 A1 | 1/2003 | Fukada | |
| 2004/0084777 A1 | 5/2004 | Yamanoue et al. | |
| 2004/0119164 A1 | 6/2004 | Kurashima et al. | |
| 2004/0150070 A1 | 8/2004 | Okada et al. | |
| 2005/0009300 A1* | 1/2005 | Murari et al. | 438/460 |
| 2005/0017363 A1 | 1/2005 | Lin et al. | |
| 2005/0026397 A1 | 2/2005 | Daubenspeck et al. | |
| 2005/0098893 A1* | 5/2005 | Tsutsue et al. | 257/758 |
| 2005/0148115 A1* | 7/2005 | Williams et al. | 438/122 |
| 2005/0151239 A1 | 7/2005 | Lee | |
| 2005/0230005 A1 | 10/2005 | Liang et al. | |
| 2005/0269702 A1 | 12/2005 | Otsuka | |
| 2005/0280120 A1 | 12/2005 | Tomita | |
| 2006/0001144 A1 | 1/2006 | Uehling et al. | |
| 2006/0012012 A1 | 1/2006 | Wang et al. | |
| 2006/0022195 A1 | 2/2006 | Wang | |
| 2006/0055002 A1 | 3/2006 | Yao et al. | |
| 2006/0055007 A1 | 3/2006 | Yao et al. | |
| 2006/0125090 A1* | 6/2006 | Chen et al. | 257/712 |
| 2006/0172457 A1* | 8/2006 | Huang | 438/106 |
| 2006/0192265 A1 | 8/2006 | Hsu | |
| 2007/0090447 A1 | 4/2007 | Morimoto et al. | |
| 2007/0090547 A1 | 4/2007 | Su et al. | |
| 2007/0158788 A1 | 7/2007 | Yang | |
| 2008/0054263 A1 | 3/2008 | Han | |
| 2008/0157284 A1 | 7/2008 | Chang et al. | |
| 2008/0265378 A1 | 10/2008 | Lee et al. | |
| 2008/0283969 A1 | 11/2008 | Jeng et al. | |
| 2009/0115024 A1 | 5/2009 | Jeng et al. | |
| 2009/0321890 A1 | 12/2009 | Jeng et al. | |
| 2010/0207251 A1 | 8/2010 | Yu et al. | |

FOREIGN PATENT DOCUMENTS

| | | |
|---|---|---|
| CN | 1701418 A | 11/2005 |
| CN | 1770432 | 5/2006 |
| CN | 1830079 | 9/2006 |
| CN | 1956173 A | 5/2007 |

OTHER PUBLICATIONS

"Motorola MC7457RX1000NB Microprocessor," Sample Prep Delamination, Motorola Chipworks, Mar. 15, 2005, 1 page, Figure 3.1.3 Die Seal.

* cited by examiner

HEAT SPREADER STRUCTURES IN SCRIBE LINES

This application claims priority to U.S. Provisional Application Ser. No. 61/114,770, filed on Nov. 14, 2008, and entitled "Heat Spreader Structures in Scribe Lines," the full disclosure of which is incorporated herein by reference.

CROSS-REFERENCE TO RELATED APPLICATIONS

This application relates to the following commonly-assigned U.S. patent applications: application Ser. No. 11/842,821, filed Aug. 21, 2007, and entitled "Seal Ring Structure with Improved Cracking Protection;" and application Ser. No. 11/933,931, filed Nov. 1, 2007, and entitled "Seal Ring Structure with Improved Cracking Protection and Reduced Problems;" and application Ser. No. 12/347,026, filed Dec. 31, 2008, entitled "Protective Seal Ring for Preventing Die-Saw Induced Stress," which applications are hereby incorporated herein by reference.

TECHNICAL FIELD

This invention relates generally to integrated circuit structures, and more particularly to heat spreader formed in scribe lines.

BACKGROUND

Integrated circuit (IC) manufacturers are employing increasingly smaller dimensions and corresponding technologies to make smaller, high-speed semiconductor devices. Along with these advancements, the challenges of maintaining yield and throughput have also increased.

A semiconductor wafer typically includes dies (also referred to as chips) separated from each other by scribe lines. Individual chips within the wafer contain circuitry, and the dies are separated by sawing and then are individually packaged. Conventionally, the sawing is performed using mechanical force. This, however, incurs mechanical force on chips adjacent to the scribe lines, resulting in damage to the chips.

Recently, laser was used for the die sawing, in which a laser is projected on the scribe line, and hence the laser-projected portions are cut apart. Advantageously, the laser sawing does not apply mechanical force to the chips, and hence the mechanical force related damage is substantially eliminated. However, laser sawing is accompanied by a significant amount of heat, which may cause the local temperature of the portions of chips close to the scribe lines to be very high. The devices that are exposed to the high temperatures may be damaged, or having their performance shifted.

Conventionally, to solve the heat problem caused by the laser sawing, scribe lines were broadened so that the laser-passing path is farther away from the neighboring chips. For example, scribe lines may have to be expanded from 80 µm to about 300 µm in width. Such an increase in the scribe lines results in the reduction of the chip count in wafers.

Accordingly, what is needed in the art is a method and/or an integrated structure that may incorporate laser sawing thereof to take advantage of the benefits associated with the reduced mechanical force while at the same time overcoming the deficiencies of the prior art.

SUMMARY OF THE INVENTION

In accordance with one aspect of the present invention, an integrated circuit structure includes a first chip having a first edge, which has a first length; and a second chip having a second edge facing the first edge. A scribe line is between and adjoining the first edge and the second edge. A heat spreader includes a portion in the scribe line, wherein the heat spreader includes a plurality of vias and a plurality of metal lines. The portion of the heat spreader in the scribe line has a second length at least close to, and may be greater than, the first length.

In accordance with another aspect of the present invention, an integrated circuit structure includes a chip having edges; scribe lines outside the chip and adjoining the edges of the chip; and a heat spreader in the scribe lines and forming a loop encircling the chip. From a center of one of the scribe lines to an edge of the chip, there exists a path consisting low-k dielectric materials connecting the center to the edge of the chip.

In accordance with yet another aspect of the present invention, an integrated circuit structure includes a chip, and scribe lines outside the chip and adjoining the edges of the chip. The scribe lines include a semiconductor substrate; a plurality of low-k dielectric layers over the semiconductor substrate; a un-doped silicate glass (USG) layer over the plurality of low-k dielectric layers; a first passivation layer over the USG layer; and a second passivation layer over the first passivation layer. A heat spreader is in the scribe lines and forming a loop encircling the chip. The heat spreader includes a plurality of metal lines, each forming a ring encircling the chip; a plurality of vias interconnecting the plurality of metal lines; and a metal plate ring in the USG layer and encircling the chip. A trench ring is in the scribe line and extending from a top surface of the second passivation layer to a level no higher than an interface between the first passivation layer and the second passivation layer. The trench ring substantially encircles the chip.

The advantageous features of the present invention include improved heat dissipating ability in laser saying. Further, the heat spreaders are formed in scribe lines, and hence do not require the reduction of the count of chips in wafers.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments are discussed in detail below. It should be appreciated, however, that the embodiments provide many applicable inventive concepts that can be embodied in a wide variety of specific contexts.

The specific embodiments discussed are merely illustrative of specific ways to make and use the invention, and do not limit the scope of the invention.

A novel heat spreading structure for spreading the heat generated during laser sawing and the method of forming the same are presented. The variations of the embodiments of the present invention are discussed. Throughout the various views and illustrative embodiments of the present invention, like reference numbers are used to designate like elements.

Figure 1:
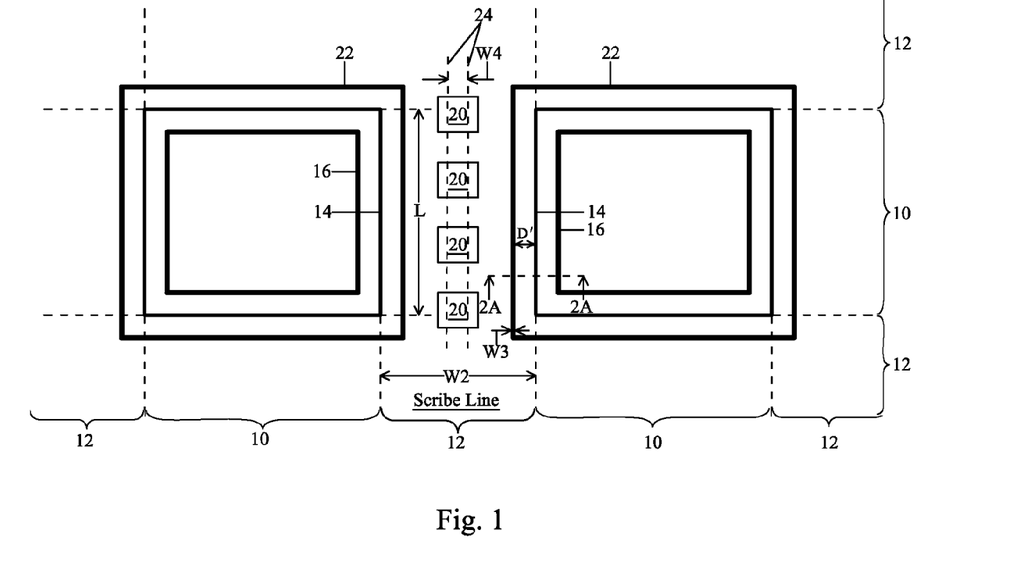
FIG. 1 illustrates a top view of two chips adjoining a scribe line, wherein heat spreaders are formed in scribe lines.

FIG. 1 illustrates a top view of an embodiment of the present invention, which includes chips 10 and the adjoining scribe lines 12. In each of chips 10, seal rings 14 and 16 are formed, wherein the outer seal ring 14 may also be referred to as a sacrificial seal ring, while the inner seal ring 16 may also be referred to as a main seal ring. Although there is a plurality of scribe lines 12, throughout the description, the term "scribe line" in a singular form is used to refer to the scribe line 12 between the two illustrated chips 10, while all scribe lines may have identical or similar structures. Scribe line 12 adjoins chips 10, with one of the scribe lines 12 between and adjoining both chips 10. The structure as shown in FIG. 1 may be a part of a wafer that includes a plurality of chips and a plurality of scribe lines. In an exemplary embodiment, chips 10 have length/width L greater than about 6 mm. One skilled in the art will realize, however, that the dimensions recited throughout the description are merely examples, and will change if different formation technologies and equipments are used. It may be realized through the subsequent teaching that for a bigger chip having a greater length/width L, the heat generated in the laser die sawing may be spread to a greater area, and hence the embodiments of the present invention is more effective in spreading heat for bigger chips. Scribe line 12 may have a width W2 less than about 160 μm.

Inside scribe line 12 resides test pads 20 (commonly referred to as process control monitor pads, or PCM pads) located on the surface of scribe line 12. Test pads 20 are used to test the properties of the wafers, such as voltages, drive currents, leakage currents, and the like. Test pads 20 may be aligned to a middle line of scribe line 12. In alternative embodiments, test pads 20 may not be formed. Heat spreaders 22 are formed in scribe lines 12, and may be formed on opposite sides of test pads 20. In an embodiment, heat spreaders 22 are spaced apart from seal ring 14 (and the edge of chips 10) by dielectric materials. Width W3 of heat spreaders 22 may be less than about 10 μm. A distance D' between a heat spreader 22 and a nearest edge of chips 10, which may also be the outer edge of seal ring 14, may be less than about 2 μm. The detailed structures of heat spreaders 22 are discussed in subsequent paragraphs.

During the die sawing process, a laser beam passes through scribe line 12, so that chips 10 are separated from each other. The region between lines 24 schematically illustrates a possible sawing path, in which the laser beam will be projected. In an exemplary embodiment, the sawing path has a width W4 between about 5 μm and about 70 μm, wherein width W4 also equals the single laser spot size of the laser beam or the combined width of multiple laser ablations. The sawing path may cut through test pads 20, or pass through the spacing between test pads 20 and heat spreaders 22. Alternatively, the sawing path my cut through one or both of heat spreaders 22.

In an embodiment, as shown in FIG. 1, each of the heat spreaders 22 forms a ring encircling one of chips 10. When a laser sawing is performed on a scribe line 12 that adjoins one of the sides of chips 10, the heat spreaders 22, which are formed of metals having high thermal conductivities, will laterally conduct the heat to the remaining three sides of each of chips 10, and vertically to the semiconductor substrate. Therefore, the local heat is spread, and the temperature close to the sawing path is reduced.

Figure 2A:
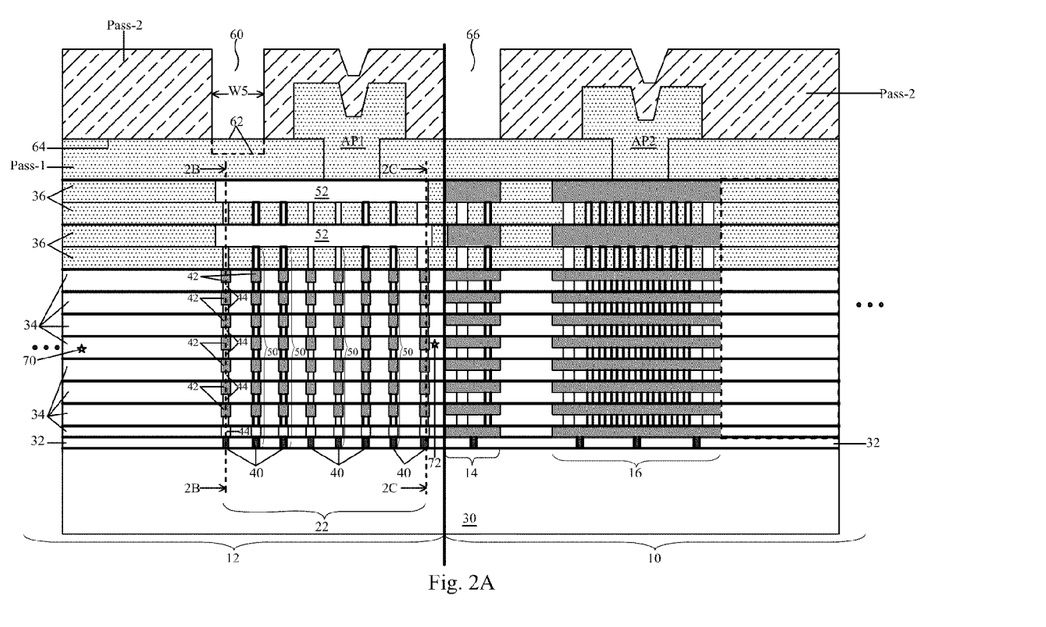
FIGS. 2A through 2E are cross-sectional views of the structure shown in FIG. 1.

FIG. 2A illustrates a cross-sectional view of a portion of the structure shown in FIG. 1, wherein the cross-sectional view is taken along the vertical plane crossing line 2A-2A in FIG. 1. It is to be noted that all conductive features shown in FIG. 2A may actually (although not necessarily) be rings. In an embodiment of the present invention, chip 10 includes semiconductor substrate 30, inter-layer dielectric (ILD) 32, inter-metal dielectric (IMD) 34 over ILD 32, and un-doped silicate glass (USG) layer(s) 36 over ILD 32. IMDs 34 may be formed of low-k dielectric materials, for example, with k values lower than about 3.0, and even lower than about 2.5. Substrate 30 may include silicon, germanium, group III-group V (also known as III-V) compound semiconductors, and/or other commonly used semiconductor materials. Integrated circuits that comprising active devices such as transistors may be formed at the surface of substrate 30. The integrated circuits may include logic circuits, memory circuits, analog circuits, digital circuits, and/or the like (not shown). First passivation layer Pass-1, and optionally second passivation layer Pass-2, are formed over USG layers 36. Passivation layers Pass-1 and Pass-2 may be formed of oxides, nitrides, and/or combinations thereof, and may be formed of the same or different materials.

In an embodiment, heat spreader 22 includes a plurality of metal lines 42 and vias 44 in IMDs 34. As is known in the art, the bottom metal lines 42 formed in the bottom one of the IMDs 34 may be formed using a single damascene process, while upper metal lines 42 may be formed together with the underlying vias 32 using dual damascene processes.

Heat spreader 22 may include contact plug 40 connecting semiconductor substrate 30 to metal lines 42 and vias 44. Contact plugs 40 may connect the overlying metal lines 42 and vias 44 to a well region in substrate 30, so that the heat may be conducted to semiconductor substrate 30 more effectively. Metal lines 42 and vias 44 are interconnected to form vertical metal columns, walls, or the like, in order to conduct heat. Metal lines 42 and vias 44 may comprise copper or copper alloys, and may be formed simultaneously with the formation of seal rings 14 and 16.

Figure 2B:
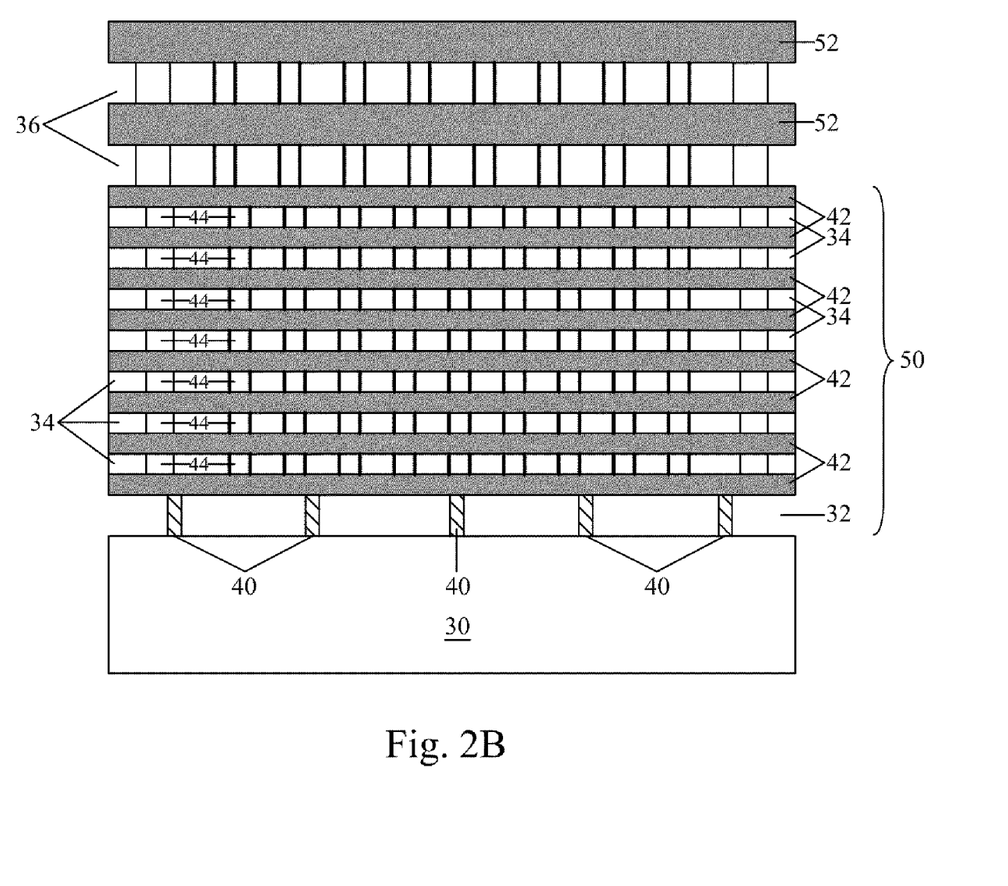
Figure 2C:
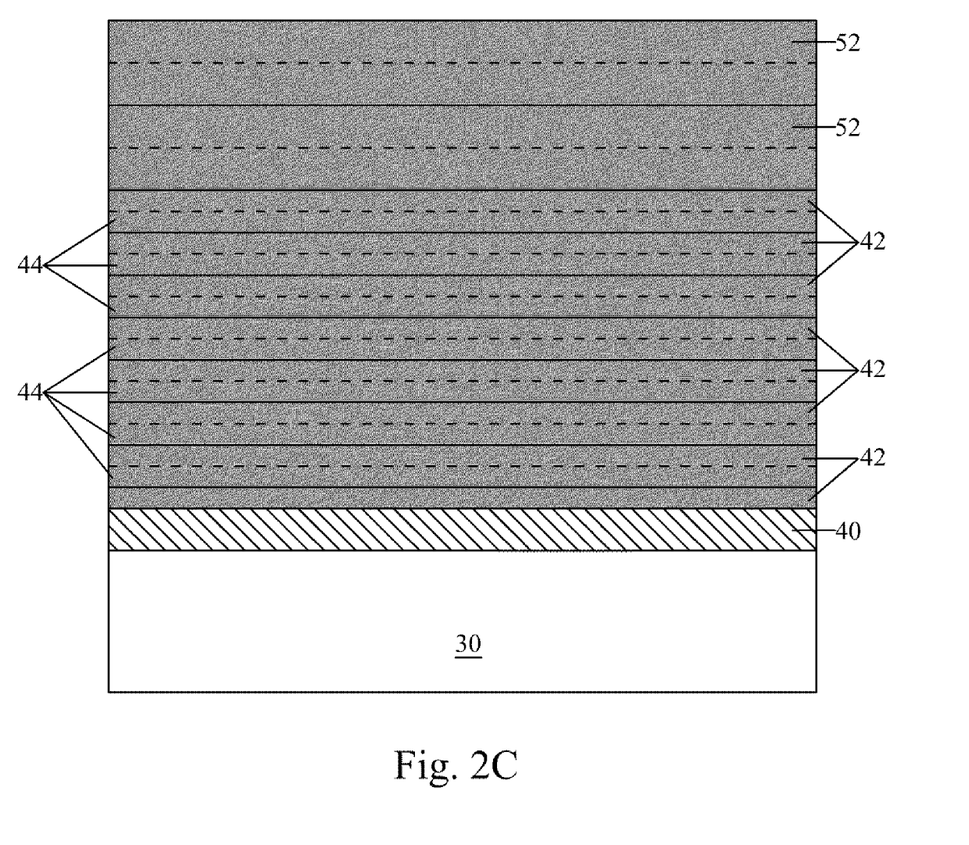

Each of the heat spreaders 22 may include only one, or more, heat spreader sub-rings 50 (if viewed from the top view), each outer ring encircling the inner ring. Each of the sub-rings 50 may be physically connected together for better heat spreading effect, for example, through metal plates 52. Each of the heat spreader sub-rings 50 may form a non-solid wall or a solid wall, as shown in FIGS. 2B and 2C, respectively.

In an embodiment, in the top one of the USG layers 36, a single continuous metal plate ring 52 is formed directly over, and interconnecting all of the heat spreader sub-rings 50. Accordingly, in the top view, the heat spreader sub-rings 50 appear to be covered by metal plate ring 52. Further, in each of the USG layers 36, there may be one continuous metal plate ring 52. In alternative embodiments, each of heat spreaders 22 includes a plurality of heat spreader sub-rings 50 with no metal plate ring 52 interconnecting them, wherein each of the plurality of heat spreader sub-rings 50 may extend from inside ILD 32 to the top one of USG layers 36.

Each of heat spreaders 22 may further include an aluminum ring (alternatively referred to as an aluminum pad, or AP1 throughout the description) over, and connected to, metal plate ring 52. Aluminum ring AP1 is formed simultaneously with the formation of bond pads (not shown) and aluminum ring AP2 that are in semiconductor chip 10.

Trench 60 is formed over heat spreaders 22. If viewed from top, trench 60 also forms a trench ring having four edges, each proximating a respective edge of semiconductor chip 10. The bottom 62 of trench 60 may at least reach interface 64 between passivation layers Pass-1 and Pass-2. In addition, bottom 62 may extend below interface 64, for example, by greater than about 200 Å. However, a layer of passivation layer Pass-1 needs to remain over metal plate ring 52 to prevent metal plate ring 52 from being exposed. If a crack occurs during die sawing and propagates along interface 64, the crack will be stopped by trench 60. Even if the crack propagates across trench 60, if at all, the stress of the crack is significantly reduced by trench 60, and seal rings 14 and 16 will effectively prevent any further propagation of the crack. This provides dual insurance for the crack prevention. It is appreciated that any crack occurring at a level higher than bottom 62 of trench 60 will also be stopped, including those occurring in passivation layer Pass-2. Trench 60 may have width W5 greater than about 1 µm. At the time the respective scribe line 12 is sawed, trench 60 is not filled. After packaging processes, trench 60 may either be unfilled, or filled with a material the same as, or different from, that of passivation layers Pass-1 and Pass-2, which material may be polyimide or other dielectric material.

Seal ring 16 may also include aluminum ring AP2, which also forms a ring proximating the edge of chip 10. Further, passivation layer Pass-2 further includes trench 66 having an outer edge substantially vertically aligned to the outer edge of the respective chip 10, and over sacrificial seal ring 14.

FIG. 2B illustrates the cross-sectional view of one of the heat spreader sub-rings 50 as shown in FIG. 2A, wherein the cross-sectional view is taken along a vertical plane crossing line 2B-2B (or 2C-2C) in FIG. 2A. FIG. 2B illustrates that metal lines 42 are continuous, and form continuous loops encircling chips 10 (refer to FIG. 1). Vias 44 are discrete via columns, with dielectric materials 34 separating the discrete via columns 44. Metal lines 42 and vias 44 thus form a non-solid metal wall that has dielectric materials embedded therein. Similarly, the portion of heat spreader 22 may also include continuous metal plate ring 52 and underlying discrete vias in USG layers 36.

FIG. 2C illustrates an alternative embodiment, and illustrates the cross-sectional view of one of the heat spreader sub-rings 50 shown in FIG. 2A, wherein the cross-sectional view is taken along a vertical plane crossing line 2C-2C (or 2B-2B) in FIG. 2A. FIG. 2C illustrates that metal lines 42 are continuous, and form continuous loops encircling chips 10 (refer to FIG. 1). Similarly, vias 44 are also solid via bars. Metal lines 42 and vias 44 thus form a solid metal wall extending from USG layers 36 into either the bottom IMD 34, or even into ILD 32 if contacts plugs 32 are also continuous contact bars (rings).

Referring back to FIG. 2A, if heat spreader sub-rings 50 has the structure as in FIG. 2C, from a point 70 in the center of scribe line 12 to a point 72 at the edge of chip 10, there is no path that is formed of low-k dielectric material for moisture to penetrate from point 70 to point 72. In alternative embodiments, all of heat spreader sub-rings 50 have the structure as shown in FIG. 2B. Accordingly, there exists a path (formed of low-k dielectric material) for moisture to penetrate from point 70 to point 72. Accordingly, heat spreader 22 cannot prevent the moisture penetration after the respective wafer is sawed. In yet other embodiments, some of the heat spreader sub-rings 50 have the structure as shown in FIG. 2B, while some of the heat spreader sub-rings 50 have the structure as shown in FIG. 2C.

Figure 2D:
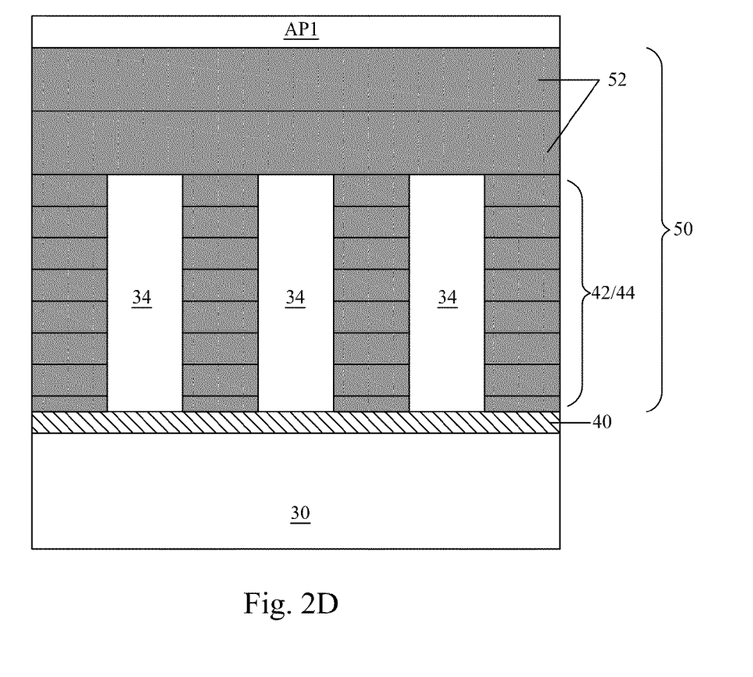
Figure 2E:
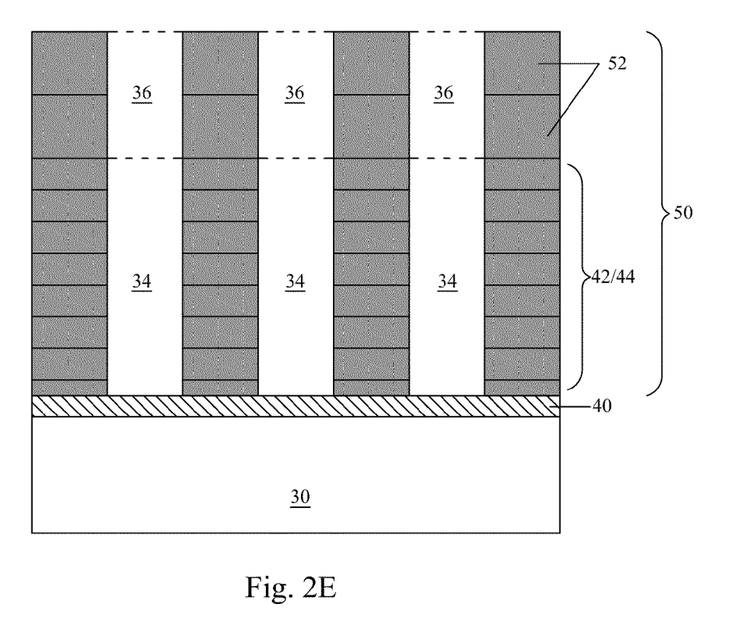

FIGS. 2D and 2E illustrate yet another embodiment, wherein the cross-sectional views of heat spreader sub-rings 50 (and/or heat spreader 22 itself) have a discontinuous structure. The cross-sectional views of FIGS. 2D and 2E are taken along vertical planes crossing line 2B-2B and/or line 2C-2C in FIG. 2A. In this case, each of the heat spreader sub-rings 50 is actually formed of a plurality of discrete metal columns, each comprising a plurality of metal lines 42 and vias 44. The discrete metal columns may extend from metal plugs 40 or inside the bottom one of the low-k dielectric layer 34 to the top one of the low-k dielectric layer 34. The discrete metal columns may be interconnected by metal plates (rings) 52, and optionally aluminum rings AP1, as shown in FIG. 2D. Alternatively, as shown in FIG. 2E, the discrete metal columns may be completely separated from each other, with no continuous metal plate (rings) 52 interconnecting them. In other words, the metal features in USG layers 36 also include a plurality of discrete features.

Figure 3:
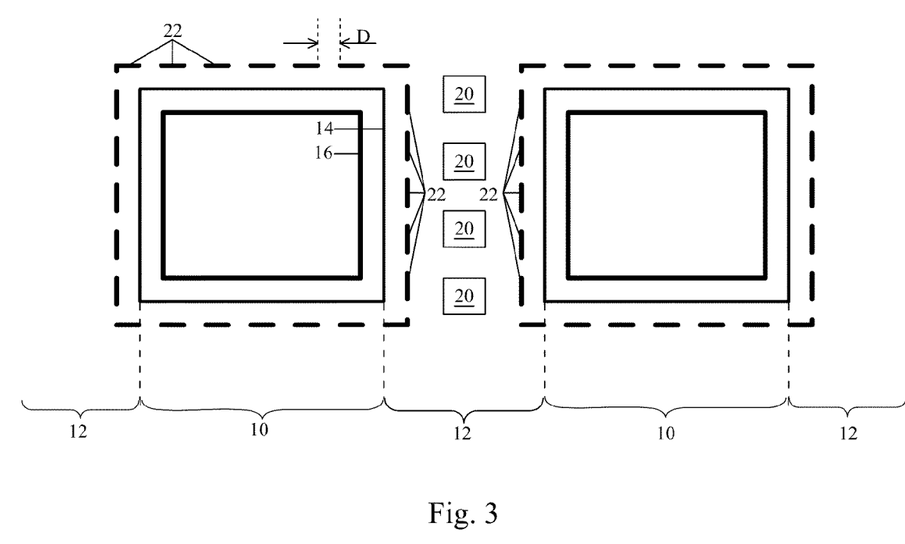
FIG. 3 illustrates a top view of two chips adjoining a scribe line, wherein discontinuous heat spreaders are formed in scribe lines.

FIG. 3 illustrates a top view of the discontinuous heat spreaders 22 as shown in FIG. 2E, which include a plurality of discrete heat spreader columns. The distance D between neighboring heat spreader columns may be less than the laser spot size of the laser used for the die sawing. In the case the laser spot size is about 5 µm to about 20 µm, distance D may be less than about 20 µm, and may also be less than about 5 µm, depending on the laser spot size. Experiment results have revealed that if distance D is greater than the laser spot size, the heat spreading effect is significantly compromised. The discrete heat spreader columns are aligned to lines parallel to the edges of chips 10.

Figure 4:
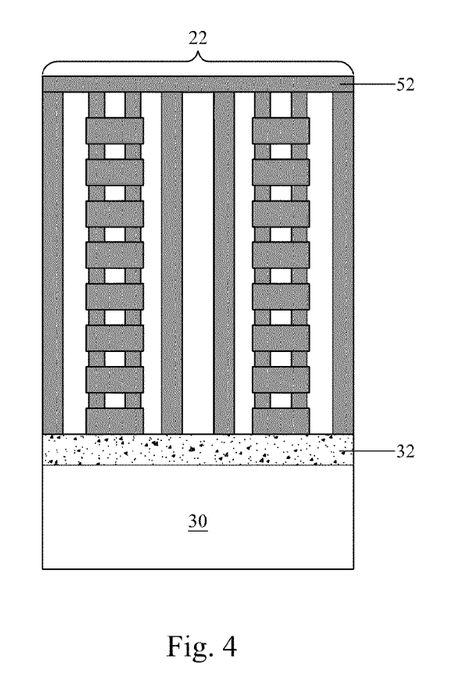
FIG. 4 illustrates a cross-sectional view of a heat spreader including a metal plate ring, but no contact plugs.
Figure 5:
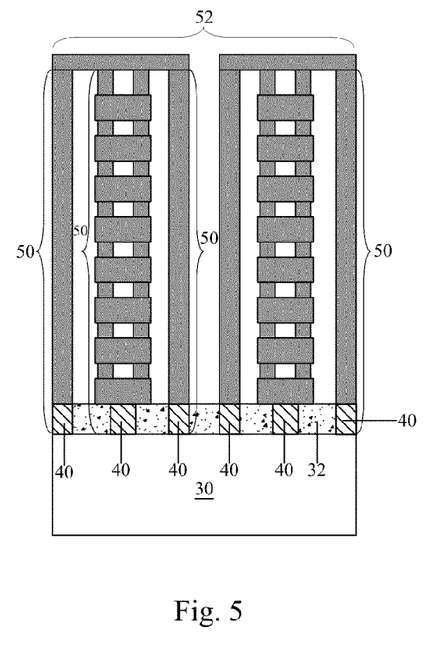
FIG. 5 illustrates a cross-sectional view of a heat spreader including contact plugs, but no metal plate ring.
Figure 6:
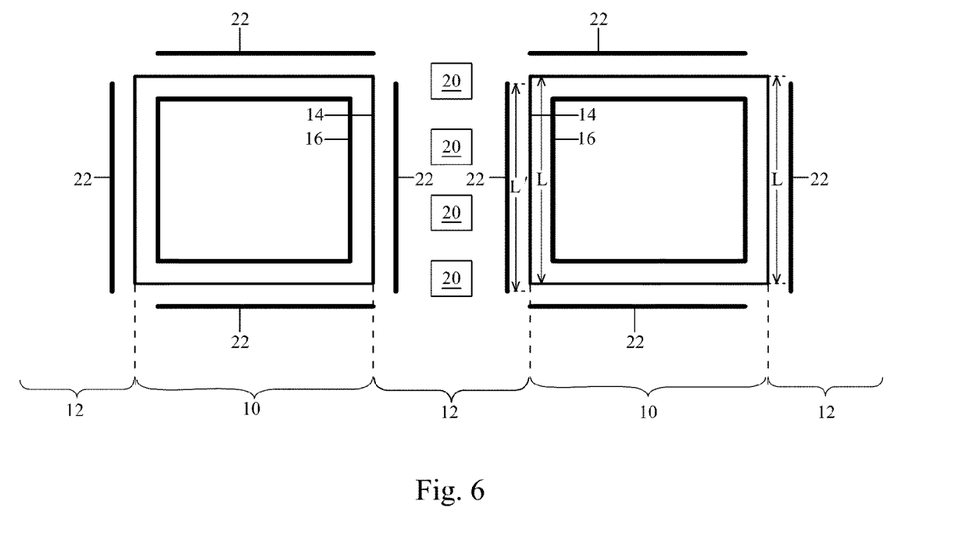
FIG. 6 illustrates a top view of two chips adjoining a scribe line, wherein heat spreaders have length close to the length of the chips, but do not form a ring.

In an embodiment, as shown in FIG. 2A, both contacts 40 and metal plate rings 52 are formed. Since heat may be spread vertically to semiconductor substrate 20 (through contact plugs 40) and horizontally to other sides of the respective chip, the heat spreading effect is optimized. In other embodiments of the present invention, contact plugs 40 are omitted, as schematically illustrated in FIG. 4. At least one metal plate rings 52, however, still remains. In yet other embodiments, as schematically illustrated in FIG. 5, contact plugs 40 remains to be formed, while the metal plate rings 52 that interconnects all sub-rings 50 are omitted. Simulation results have revealed that the embodiments shown in FIGS. 4 and 5 are still capable of spreading heat, however, with reduced effect than the embodiment shown in FIG. 2A. Further, although in the preceding embodiments, each side of the heat spreaders 22 are shown as being longer than the respective edge of the chip, the length L' (refer to FIG. 6) of the heat spreader may also be substantially equal to, for example, greater than about 80 percent of the length L of the respective edge of chip 10. In this case, the heat spreader 22 on one side of the chip may be disconnected from the heat spreaders 22 on the other sides of the same chip 10, as illustrated in FIG. 6.

The embodiments of the present invention have several advantageous features. By forming heat spreaders inside scribe lines, the heat generated in the laser die sawing is effectively spread to greater regions of the respective wafer, and hence the local temperature is reduced. Since the heat spreaders are formed inside scribe lines, there is no need to increase the widths of scribe lines. The chip area is thus saved. The embodiments of the present invention fully utilize the existing integrated circuit formation processes, without requiring additional masks and process steps. In embodiments, the integrated circuits described above in conjunction with FIGS. 1-6 can be formed within a system that can be physically and electrically coupled with a printed wiring board or printed circuit board (PCB) to form an electronic assembly. The electronic assembly can be part of an electronic system such as computers, wireless communication devices, computer-related peripherals, entertainment devices, or the like. The system can provide an entire system in one IC, so-called system on a chip (SOC) or system on integrated circuit (SOIC) devices. These SOC devices may provide, for example, all of the circuitry needed to implement a cell phone, personal data assistant (PDA), digital VCR, digital camcorder, digital camera, MP3 player, or the like in a single integrated circuit.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. An integrated circuit structure comprising:
    a first chip comprising a first edge having a first length;
    a second chip having a second edge facing the first edge;
    a plurality of dielectric layers extending from inside the first chip to inside the second chip;
    a scribe line between and adjoining the first edge and the second edge; and
    a heat spreader comprising a portion in the scribe line, wherein the heat spreader comprises a plurality of metal lines with each being in one of the plurality of dielectric layers, and a plurality of vias with each connecting an overlying one to an underlying one of the plurality of metal lines, and wherein the portion of the heat spreader in the scribe line has a second length at least close to the first length.

2. The integrated circuit structure of claim 1, wherein the second length is greater than the first length.

3. The integrated circuit structure of claim 1, wherein the heat spreader comprises a metal line, and a via underlying and electrically connected to the metal line, wherein a width of the via is substantially the same as a width of the metal line.

4. The integrated circuit structure of claim 1, wherein the heat spreader comprises a continuous metal plate ring encircling the first chip, and wherein an entirety of the heat spreader is inside scribe lines adjoining the first chip.

5. The integrated circuit structure of claim 4, wherein the heat spreader comprises a plurality of heat spreader sub-rings, each forming a continuous ring encircling the first chip, and wherein the continuous metal plate ring is over, and connected to, the plurality of heat spreader sub-rings.

6. The integrated circuit structure of claim 1, wherein the plurality of vias in the heat spreader are all in the form of via bars, and wherein the heat spreader comprises at least one solid metal wall encircling the first chip.

7. The integrated circuit structure of claim 1, wherein the plurality of vias in the heat spreader comprises discrete vias separated by dielectric materials, and wherein from a center of the scribe line to the first edge of the first chip, there exists a path comprised solely of low-k dielectric materials and connecting the center to the first edge.

8. The integrated circuit structure of claim 1, wherein the heat spreader is discontinuous and comprises heat spreader columns aligned in a line parallel to the first edge, and wherein each of the heat spreader columns comprises a plurality of metal line layers and a plurality of via layers.

9. The integrated circuit structure of claim 8, wherein distances between neighboring ones of the heat spreader columns are less than about 5 μm.

10. The integrated circuit structure of claim 1 further comprising an aluminum ring directly over, and adjoining, the heat spreader.

11. The integrated circuit structure of claim 1 further comprising:
    a first passivation layer over the heat spreader;
    a second passivation layer over the first passivation layer; and
    a trench ring in the second passivation layer and having a bottom no higher than an interface between the first passivation layer and the second passivation layer, the trench ring encircling the first chip and being substantially directly over the heat spreader.

12. The integrated circuit structure of claim 1 further comprising:
    test pads in the scribe line and aligned in a lengthwise direction of the scribe line; and
    an additional heat spreader in the scribe line and on an opposite side of the test pads than the heat spreader.

13. The integrated circuit structure of claim 1, wherein the portion of the heat spread in the scribe line comprises:
    a first edge in the scribe line and facing toward the first chip, wherein the first edge contacts a dielectric material in the scribe line; and
    a second edge in the scribe line and facing toward the second chip, wherein the second edge contacts the dielectric material in the scribe line.

14. The integrated circuit structure of claim 13, wherein the portion of the heat spread in the scribe line further comprises:
    a third edge in the scribe line and contacting the dielectric material in the scribe line; and
    a fourth edge in the scribe line and contacting the dielectric material in the scribe line, wherein the third and the fourth edges are perpendicular to the first and the second edges.

15. The integrated circuit structure of claim 1, wherein the plurality of dielectric layers comprises low-k dielectric layers having k values lower than about 3.0.

* * * * *